United States Patent
Po et al.

(10) Patent No.: US 12,389,734 B2
(45) Date of Patent: Aug. 12, 2025

(54) INVERTED POLYMER PHOTOVOLTAIC CELL AND METHOD FOR PREPARATION THEREOF

(71) Applicant: ENI S.P.A., Rome (IT)

(72) Inventors: Riccardo Po, Novara (IT); Gianni Corso, Novara (IT); Riccardo Barbieri, Novara (IT)

(73) Assignee: ENI S.P.A., Rome (IT)

( * ) Notice: Subject to any disclaimer, the term of this patent is extended or adjusted under 35 U.S.C. 154(b) by 261 days.

(21) Appl. No.: 18/020,201

(22) PCT Filed: Aug. 6, 2021

(86) PCT No.: PCT/IB2021/057247
§ 371 (c)(1),
(2) Date: Feb. 7, 2023

(87) PCT Pub. No.: WO2022/034451
PCT Pub. Date: Feb. 17, 2022

(65) Prior Publication Data
US 2023/0309371 A1    Sep. 28, 2023

(30) Foreign Application Priority Data
Aug. 12, 2020    (IT) .................. 102020000020062

(51) Int. Cl.
*H10K 30/30*    (2023.01)
*H10K 30/50*    (2023.01)
(Continued)

(52) U.S. Cl.
CPC .......... *H10K 30/30* (2023.02); *H10K 30/81* (2023.02); *H10K 85/111* (2023.02);
(Continued)

(58) Field of Classification Search
CPC ...... H10K 30/50; H10K 30/81; H10K 85/151; H10K 85/113; H10K 85/1135; H10K 85/215; H10K 85/111; H10K 30/30
See application file for complete search history.

(56) References Cited

U.S. PATENT DOCUMENTS

| | | | |
|---|---|---|---|
| 4,146,574 A | 3/1979 | Onoda et al. | |
| 5,792,721 A | 8/1998 | Grate et al. | |
| 2018/0175314 A1* | 6/2018 | Kippelen | ............... H10K 85/10 |

FOREIGN PATENT DOCUMENTS

| | | |
|---|---|---|
| CN | 103400941 A | 11/2013 |
| CN | 107591488 A * | 1/2018 |

(Continued)

OTHER PUBLICATIONS

CN-107591488-A English machine translation (Year: 2018).*
(Continued)

*Primary Examiner* — Andrew J Golden
(74) *Attorney, Agent, or Firm* — CANTOR COLBURN LLP

(57) ABSTRACT

An inverted polymer photovoltaic cell (or solar cell) includes an anode;
    a first anodic interlayer (buffer layer) based on PEDOT: PSS [poly(3,4-ethylenedioxythiophene):polystyrene sulfonate];
    an active layer having at least one photoactive organic polymer as an electron donor and at least one electron acceptor organic compound;
    a cathodic interlayer (buffer layer);
    and a cathode. A second anodic interlayer (buffer layer) includes at least one heteropolyacid and, optionally, at least one amino compound is placed between the first anodic interlayer (buffer layer) and the active layer.
The inverted polymer photovoltaic cell (or solar cell) shows good values of photoelectric conversion efficiency (power
(Continued)

conversion efficiency—PCE) (η) and, in particular, a good level of adhesion between the different layers, more specifically between the active layer and the first anodic interlayer (buffer layer).

16 Claims, 1 Drawing Sheet

(51) Int. Cl.
    *H10K 30/81*       (2023.01)
    *H10K 85/10*       (2023.01)
    *H10K 85/20*       (2023.01)

(52) U.S. Cl.
    CPC ....... *H10K 85/113* (2023.02); *H10K 85/1135* (2023.02); *H10K 85/151* (2023.02); *H10K 85/215* (2023.02); *H10K 30/50* (2023.02)

(56) References Cited

FOREIGN PATENT DOCUMENTS

| | | | |
|---|---|---|---|
| WO | 2010046114 A2 | 4/2010 | |
| WO | 2016180988 A1 | 11/2016 | |
| WO | 2018122707 A1 | 7/2018 | |
| WO | WO-2018154444 A1 * | 8/2018 | ............ C01G 39/02 |
| WO | 2019175367 A1 | 3/2019 | |

OTHER PUBLICATIONS

Lu et al., A Switchable Interconnecting Layer for High Performance Tandem Organic Solar Cell, Adv. Energy Mater. 2017, 7, 1701164. (Year: 2017).*
Jeon et al, Surface initiated oxidative crosslinking of a polymeric hole transport material for improved efficiency and lifetime in soluble organic light-emitting diodes, Organic Electronics 38 (2016) 278-282. (Year: 2016).*
Angmo D. et al., "Flexible ITO-Free Polymer Solar Cells" Journal of Applied Polymer Science (2013), vol. 129, Issue 1, p. 1-14.
Chen J. et al., "Development of Novel Conjugated Donor Polymers for High-Efficiency Bulk-Heterojunction Photovoltaic Devices" Accounts of chemical research (2009), vol. 42, No. 11, p. 1709-1718.
Dkhil S. B. et al., "Square-Centimeter-Sized High-Efficiency Polymer Solar Cells: How the Processing Atmosphere and Film Quality Influence Performance at Large Scale", Advanced Energy Material (2016), vol. 6, 1600290, 10 pages.
Fang, G. et al. "Enhanced Performance for Polymer Solar Cells by Using Surfactant-Modified PEDOT:PSS as the Anode Buffer Layer", Macromolecular Chemistry and Physics (2011), vol. 12, Issue 17, p. 1846-1851.
Hammond, S. R. et al., "Low-temperature, solution-processed molybdenum oxide hole-collection layer for organic photovoltaics", Journal of Materials Chemistry (2012), vol. 22, p. 3249-3254.
International Search Report and Written Opinion for International Application No. PCT/IB2021/057247, International Filing Date Aug. 6, 2021, Date of Mailing Nov. 8, 2021, 11 pages.
Kim J.-H. et al., "Improving Charge Transport of P3HT:PCBM Organic Solar Cell using MoO3 Nanoparticles as an Interfacial Buffer Layer" Electronic Materials Letters (2016), vol. 12, No. 3, p. 383-387.
Krebs, F. C., in "Fabrication and processing of polymer solar cells: A review of printing and coating techniques" Solar Energy Materials & Solar Cells (2009), vol. 93, p. 394-412.
Liang, Y. et al., "A New Class of Semiconducting Polymers for Bulk Heterojunction Solar Cells with Exceptionally High Performance" Accounts of Chemical Research (2010), vol. 43 (9), p. 1227-1236.
Liang, Y. et al., "Highly Efficient Solar Cell Polymers Developed via Fine-Tuning of Structural and Electronic Properties", Journal of the American Chemical Society (2009), vol. 131 (22), p. 7792-7799.
Liu Y. et al., "Aggregation and morphology control enables multiple cases of high-efficiency polymer solar cells" Nature Communications (2014), vol. 5, Paper No. 5293, 8 pages.
Liu, J et al., "Low-temperature MoO3 film from a facile synthetic route for an efficient anode interfacial layer in organic optoelectronic devices" Journal of Materials Chemistry C (2014), vol. 2, p. 158-163.
Murase S. et al., "Solution Processed MoO3 Interfacial Layer for Organic Photovoltaics Prepared by a Facile Synthesis Method" Advanced Materials (2012), vol. 24, p. 2459-2462.
Nielsen, C. B. et al., "Non-Fullerene Electron Acceptors for Use in Organic Solar Cells" Accounts of Chemical Research (2015), vol. 48, p. 2803-2812.
Odyakov, V. F. et al., Synthesis of molybdovanadophosphoric heteropoly acid solutions having modified composition, Applied Catalysis A General (2008), vol. 342 (1), p. 126-130.
Pan H. et al., "Thieno[3,4-c]pyrrole-4,6-dione based copolymers for high 4 performance organic solar cells and organic field effect transistors", Chinese Chemical Letters (2016), vol. 27, Issue 8, p. 1277-1282.
Po R. et al., "From lab to fab: how must the polymer solar cell materials design change?—an industrial perspective" Energy & Environmental Science (2014), vol. 7, p. 925-943.
Po R. et al., "Interfacial Layers", Organic Solar Cells—Fundamentals, Devices, and Upscaling (2014), Chapter 4, 38 pages.
Po' R. et al., "All That Glisters Is Not Gold": An Analysis of the Synthetic Complexity of Efficient Polymer Donors for Polymer Solar Cells Macromolecules (2015), vol. 48 (3), p. 453-461.
Synooka, O. et al., "Modification of the Active Layer/PEDOT:PSS Interface by Solvent Additives Resulting in Improvement of the Performance of Organic Solar Cells", ACS Applied Materials & Interfaces (2014), vol. 6 (14), p. 11068-11081.
Valimaki M. et al. "R2R-printed inverted OPV modules—towards arbitrary patterned designs", Nanoscale (2015), vol. 7, p. 9570-9580.
Vasilopoulou, M. et al., in "Old Metal Oxide Clusters in New Applications: Spontaneous Reduction of Keggin and Dawson Polyoxometalate Layers by a Metallic Electrode for Improving Efficiency in Organic Optoelectronics", Journal of the American Chemical Society (2015), vol. 137 (21), p. 6844-6856.
Xu, M.F et al., "Aqueous solution-processed MoO3 as an effective interfacial layer in polymer/fullerene based organic solar cells" Organic Electronics (2013), vol. 14, p. 657-664.
Yoo S. et al., "Electrodes in Organic Photovoltaic Cells," in "Organic Solar Cells—Fundamentals, Devices, and Upscaling" (2014), Chapter 5, Richter H. and Rand B. Eds., Pan Stanford Publishing Pte Ltd.
Zhan C. et al., "New advances in non-fullerene acceptor based organic solar cells", RSC Advances (2015), vol. 5, p. 93002-93026.
Zhu Yawen et al: "A cost-effectivecommercial soluble oxide cluster for highly efficient and stable organic solar cells", Journal of Materials Chemistry A, vol. 2, No. 5, Oct. 28, 2013, 1436-1442.
Zilberg, K. et al., "Low-Temperature, Solution-Processed MoOx for Efficient and Stable Organic Solar Cells" Applied Materials & Interfaces (2012), vol. 4, p. 1164-1168.

* cited by examiner

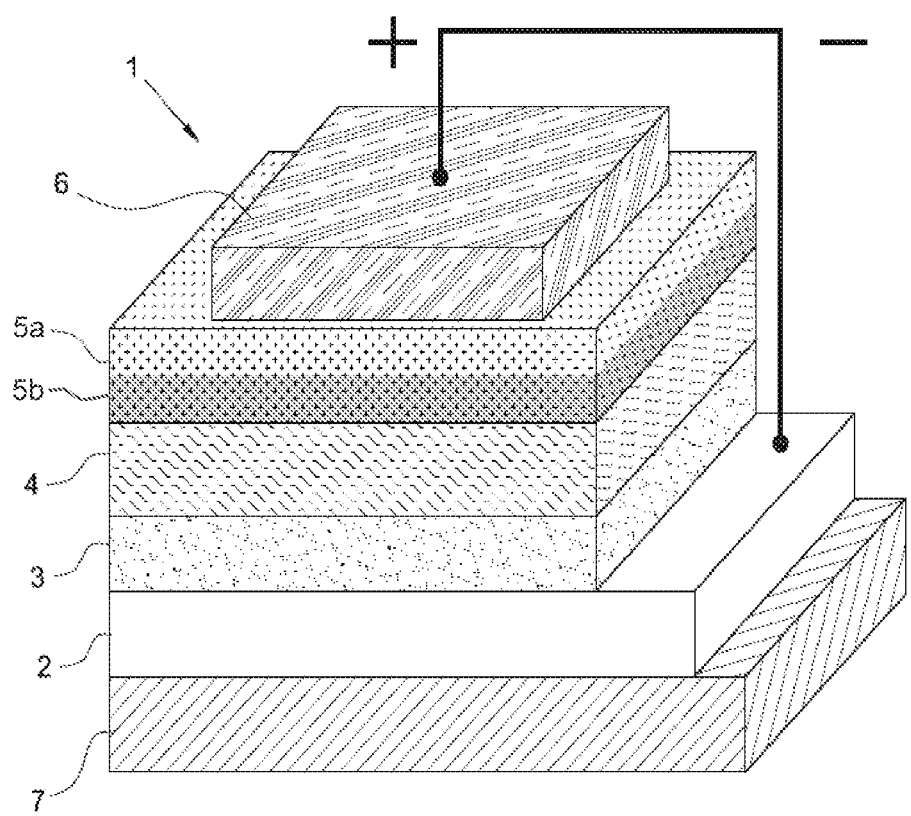

INVERTED POLYMER PHOTOVOLTAIC CELL AND METHOD FOR PREPARATION THEREOF

CROSS-REFERENCE TO RELATED APPLICATIONS

The present application is a 35 U.S.C. § 371 National Stage patent application of International patent application PCT/IB2021/057247, filed on 6 Aug. 2021, which claims priority to Italian patent application 102020000020062, filed on 12 Aug. 2020, the contents of which are hereby incorporated in their entirety.

TECHNICAL FIELD

The present disclosure relates to an inverted polymer photovoltaic cell (or solar cell).

More particularly, the present disclosure relates to an inverted polymer photovoltaic cell (or solar cell) comprising an anode; a first anodic interlayer (buffer layer) based on PEDOT:PSS [poly(3,4-ethylenedioxythiophene):polystyrene sulfonate]; an active layer comprising at least one photoactive organic polymer as an electron donor and at least one organic electron acceptor compound; a cathodic interlayer (buffer layer); a cathode; wherein a second anodic interlayer (buffer layer) comprising at least one heteropolyacid and, optionally, at least one amino compound is placed between said first anodic interlayer (buffer layer) and said active layer.

Said inverted polymer photovoltaic cell (or solar cell) shows good values of photoelectric conversion efficiency (power conversion efficiency—PCE) ($\eta$) and, in particular, a good level of adhesion between the different layers, more specifically between the active layer and said first anodic interlayer (buffer layer).

The present disclosure also relates to a process for the preparation of the previously mentioned inverted polymer photovoltaic cell (or solar cell).

BACKGROUND

Photovoltaic devices (or solar devices) are devices capable of converting the energy of a light radiation into electrical energy. Currently, most photovoltaic devices (or solar devices) usable for practical applications exploit the physico-chemical properties of photoactive inorganic materials, in particular high purity crystalline silicon. However, due to the high production costs of silicon, scientific research has for some time been orienting its efforts towards the development of alternative organic materials with a polymeric structure [the so-called polymeric photovoltaic cells (or solar cells)]. In fact, unlike high purity crystalline silicon, said organic materials are characterized by a relative ease of synthesis, a low production cost, a reduced weight of the related photovoltaic device (or solar device), as well as allowing the recycling of said organic materials at the end of the life cycle of the device in which they are used.

The above advantages therefore make the use of said organic materials energetically and economically attractive despite any lower photoelectric conversion efficiency ($\eta$) of the solar radiation of organic photovoltaic devices (or solar devices) obtained with respect to inorganic photovoltaic devices (or solar devices).

The operation of organic photovoltaic devices (or solar devices) such as, for example, polymeric photovoltaic cells (or solar cells), is based on the combined use of an electron acceptor compound and an electron donor compound.

In the state of the art, the electron donor compound most commonly used in the construction of polymeric photovoltaic cells (or solar cells) is the regioregular poly(3-hexylthiophene) (P3HT). This polymer has excellent electronic and optical characteristics [e.g., good values of the HOMO and LUMO orbitals, good molar absorption coefficient ($\epsilon$)], good solubility in the solvents that are used to manufacture polymeric photovoltaic cells (or solar cells), and a fair mobility of the electron holes.

Other examples of polymers which can be advantageously used as electron donor compounds are: the polymer PCDTBT {poly[N-9'''-heptadecanyl-2,7-carbazole-alt-5,5-(4',7'-di-2-thienyl-2',1',3'-benzothiadiazole)]}, the polymer PCPDTBT {poly[2,6-(4,4-bis-(2-ethylhexyl)-4H-cyclopenta[2,1-b;3,4-b']dithiophene)-alt-4,7(2,1,3-benzothiadiazole)]}, the polymer PffBT4T-2OD {poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)]}, the polymer PB-DB-T {poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]}.

In the state of the art, the electron acceptor compounds most commonly used in the production of polymeric photovoltaic cells (or solar cells) are derivatives of fullerene such as, for example, [6,6]-phenyl-$C_{61}$-butyric acid methyl ester (PCBM), [6,6]-phenyl-$C_{71}$-butyric acid methyl ester ($PC_{71}BM$). Said fullerenes derivatives have led to the greatest photoelectric conversion efficiencies ($\eta$) when mixed with electron donor compounds selected from $\pi$-conjugated polymers such as, for example, polythiophenes ($\eta$>5%), polycarbazoles ($\eta$>6%), derivatives of poly(thienotiophene) benzodithiophene (PTB) ($\eta$>8%), fluorinated polymers of benzothiadiazole ($\eta$>10%).

The elementary process of converting light into electric current in a polymeric photovoltaic cell (or solar cell) occurs through the following stages:

1. absorption of a photon by the electron donor compound with the formation of an exciton, i.e. a pair of electron-electron hole charge carriers;
2. diffusion of the exciton in a region of the electron donor compound up to the interface with the electron acceptor compound, where its dissociation can take place;
3. dissociation of the exciton in the two charge carriers: electron (−) in the accepting phase (i.e. in the electron acceptor compound) and electron hole (+) in the donor phase (i.e. in the electron donor compound);
4. carrying the charges thus formed to the cathode [electron (−) through the electron acceptor compound] and to the anode [electron hole (+) through the electron donor compound], with generation of an electric current in the circuit of the polymeric photovoltaic cell (or solar cell).

The photoabsorption process with the formation of the exciton and subsequent transfer of the electron to the electron acceptor compound involves the excitation of an electron from the HOMO (Highest Occupied Molecular Orbital) to the LUMO (Lowest Unoccupied Molecular Orbital) of the electron donor compound and, subsequently, the transition from this to the LUMO of the electron acceptor compound.

Since the efficiency of a polymeric photovoltaic cell (or solar cell) depends on the number of free electrons that are generated by dissociation of the excitons, one of the structural characteristics of electron donor compounds that most affects this efficiency is the energy difference between the HOMO and LUMO orbitals of the electron donor compound (so-called band-gap). From this difference depends, in particular, the wavelength of the photons that the electron donor compound is able to collect and efficiently convert into electrical energy (the so-called photon harvesting or light harvesting process).

From the point of view of electronic characteristics, the improvements related to the materials used in the realization of polymeric photovoltaic cells (or solar cells) are possible through the design of the molecular structure of the electron donor compound and of the electron acceptor compound in order to regulate optimal energy levels (HOMO-LUMO) of both. In particular, to obtain the dissociation of the exciton formed in the process and avoid the re-transfer of charge, it is necessary that the difference both between the HOMO of the electron donor compound and of the electron acceptor compound, and between the LUMO of the electron donor compound and of the electron acceptor compound, must have an optimal value between 0.3 eV and 0.5 eV. Furthermore, the band-gap, i.e. the difference in energy between HOMO and LUMO of the electron donor compound, on the one hand must not be too high to allow the absorption of the greatest number of photons, on the other hand, it must not be too low because it could decrease the voltage at the polymeric photovoltaic cell (or solar cell) electrodes.

Another important characteristic of the materials used in the construction of polymeric photovoltaic cells (or solar cells) is the mobility of electrons in the electron acceptor compound and of the electron holes in the electron donor compound, which determines the ease with which the electric charges, once photogenerated, reach the electrodes.

Electron mobility, i.e. the mobility of electrons in the electron acceptor compound and of the electron holes in the electron donor compound, as well as being an intrinsic property of molecules, is also strongly influenced by the morphology of the active layer that contains them, which in turn depends on the mutual miscibility of the compounds used in said active layer and on their solubility. To this end, the phases of said active layer must neither be too dispersed nor too segregated.

The morphology of the active layer is also critical as regards the effectiveness of the dissociation of the photogenerated pairs electron hole-electron. In fact, the average lifetime of the exciton is such that it is able to diffuse into the organic material for an average distance not exceeding 10 nm-20 nm. Consequently, the phases of the electron donor compound and the electron acceptor compound must be organized into nanodomains of comparable size with this diffusion distance. Furthermore, the contact area of the electron donor compound-electron acceptor compound must be as large as possible and there must be preferential paths to the electrical contacts. Furthermore, this morphology must be reproducible and must not change over time.

In the simplest way of operating, polymeric photovoltaic cells (or solar cells) are manufactured by introducing between two electrodes, usually consisting of indium tin oxide (ITO) (anode) and aluminum (Al) (cathode), a thin layer (about 100 nanometers) of a mixture of the electron acceptor compound and the electron donor compound (bulk heterojunction)]. Generally, in order to create a layer of this type, a solution of the two components (i.e. electron acceptor compound and electron donor compound) is prepared and, subsequently, an active layer is created on the anode [indium-tin oxide (ITO)] starting from this solution, using appropriate deposition techniques such as, for example, spin-coating, spray-coating, ink-jet printing, slot die coating, gravure printing, screen printing, and the like. Finally, the counter-electrode [i.e. the aluminum cathode (Al)] is deposited on the dried active layer by means of known techniques, for example, by evaporation. Optionally, between the anode and the active layer and/or between the cathode and the active layer, other additional layers can be introduced (called interlayers or buffer layers) capable of performing specific functions of an electrical, optical, or mechanical nature.

Generally, for example, in order to favor the reaching of the anode [indium-tin oxide (ITO)] by the electron holes and at the same time block the transport of electrons, thus improving the collection of charges by the anode and inhibiting the recombination phenomena, before creating the active layer starting from the mixture of the electron acceptor compound and the electron donor compound as described above, a layer starting from an aqueous suspension comprising PEDOT:PSS [poly(3,4-ethylenedioxythiophene):polystyrene sulfonate] is deposited, using suitable deposition techniques such as, for example, spin-coating, spray-coating, ink-jet printing, slot die coating, gravure printing, screen printing, and the like.

More details regarding the different deposition techniques can be found, for example, in Krebs F. C., in "*Solar Energy Materials & Solar Cells*" (2009), Vol. 93, pg. 394-412.

Inverted polymer photovoltaic cell (or solar cell), generally reported in literature, comprise, on the other hand, the following layers: (i) a support in transparent material; (ii) an indium tin oxide (ITO) cathode; (iii) a cathodic buffer layer which acts as an electron carrier and as a barrier to electron holes generally comprising zinc oxide; (iv) an active layer comprising an electron donor compound and an electron acceptor compound generally selected from those reported above; (v) an anodic interlayer (buffer layer) which acts as a carrier of electron holes and as an electron barrier including a hole transporting material, generally selected from molybdenum oxide, tungsten oxide, vanadium oxide, (vi) an anode, generally, of silver (Ag), gold (Au) or aluminum (Al).

Generally, in order to protect said polymeric photovoltaic cells (or solar cells), both with traditional architecture and with inverted structure, from mechanical stresses and atmospheric agents, and for their use in real conditions, said photovoltaic cells (or solar cells) are encapsulated in a suitable material [for example, hybrid multilayer films based on poly(ethylene terephthalate), inorganic oxides].

Generally, the aforementioned anodic interlayer (buffer layer) is obtained through a deposition process of molybdenum oxide (or, alternatively, of tungsten or vanadium oxide) carried out by evaporation under vacuum of said molybdenum oxide, at high temperature and under high vacuum (for example, $10^{-5}$ mm Hg-$10^{-7}$ mm Hg). However, said deposition process has some drawbacks such as, for example: long times as it is necessary to bring the deposition chamber to the required pressures and it takes sufficient time to reach the thickness of material necessary for the operation of the final photovoltaic (or solar cell) and, consequently, a lengthening of process times and an increase in process costs; high energy consumption; significant waste of material mainly due to the fact that the oxide vapors fill the deposition chamber and are uniformly deposited on a much larger surface than is actually needed, corresponding to the final photovoltaic cell (or solar cell).

In order for the aforementioned inverted polymer photovoltaic cells (or solar cells) to find industrial application on a large scale, it is therefore necessary that suitable production processes be developed, capable of overcoming the aforementioned drawbacks. Efforts have therefore been made in this direction.

For example, Vdlimaki M. et al., in "*Nanoscale*" (2015), Vol. 7, pg. 9570-9580, describe a process for the manufacture of organic photovoltaic (OPV) modules with inverted structure through roll-to-roll (R2R) molding using the following deposition techniques: gravure printing and rotary screen-printing. In said inverted structure organic photovoltaic (OPV) modules the anodic interlayer (buffer layer) includes PEDOT:PSS [poly(3,4-ethylenedioxy-thiophene): polystyrene sulfonate] and is obtained by rotary screen-printing.

However, as reported, for example by Dkhil S. B. et al., in "*Advanced Energy Materials*" (2016), Vol. 6, 1600290, the use of anodic interlayer (buffer layers) comprising materials other than molybdenum oxide generally causes a reduction in the efficiencies of the obtained organic solar cells: in fact, organic solar cells wherein the anodic interlayer (buffer layer) is obtained by means of a molybdenum oxide deposition process carried out by vacuum evaporation of said molybdenum oxide, can reach efficiencies higher than 9%.

Furthermore, the use of PEDOT:PSS [poly(3,4-ethylene-dioxy-thiophene):polystyrene sulfonate], generally in aqueous suspension or in mixed water/alcohol solvents, as a material for the anodic interlayer (buffer layer), has some drawbacks from a practical point of view, known to those skilled in the art. The first drawback is represented by the strong acidity of the solution used which generally has a pH equal to 2 or 3, which determines a long-term instability of the polymeric photovoltaic cells (or solar cells), caused by the gradual corrosion of the anode with which said anodic interlayer (buffer layer) is in contact, or with the cathode, following the slow diffusion of the $H^+$ ions through the active layer. A second drawback is represented by the fact that the aqueous suspension has very poor wettability properties towards the active layer: this causes an uneven covering of the layer itself and therefore a reduction in the effectiveness of the anodic interlayer (buffer layer) in acting by layer of carrier of electron holes. It is possible to overcome this drawback by modifying said suspension with the addition of suitable surfactants, but this determines, on the one hand, an increase in the cost of the material, and on the other a decrease in the conductivity of said anodic interlayer (buffer layer), as the surfactants act as electrical insulators.

Therefore, the use of PEDOT:PSS [poly(3,4-ethylenedioxy-thiophene):polystyrene sulfonate], is not an optimal solution in the manufacture of polymeric photovoltaic cells (or solar cells) and it is therefore of great interest to identify alternative routes.

Among the soluble materials alternative to PEDOT:PSS [poly(3,4-ethylenedioxythiophene):polystyrene sulfonate] proposed by the scientific community we can cite, for example, the soluble derivatives of molybdenum or vanadium. For example, Xu M.-F. et al., in "*Organic Electronics*" (2013), Vol. 14, pg. 657-664, describe the use of an aqueous solution of molybdenum oxide ($MoO_3$) in order to create an anodic interlayer (buffer layer) in conventional dispersed heterojunction (bulk heterojunction) organic solar cells [comprising poly(3-hexylthiophene) (P3HT) and fullerene]. However, this solution cannot be used in inverted organic solar cells, as said aqueous solution would not be able to adequately wet the active layer.

Liu J. et al., in "*Journal of Materials Chemistry C*" (2014), Vol. 2, pg. 158-163, describe the use of a solution of molybdenum oxide ($MoO_3$) in ammonia-water in order to create an anodic interlayer (buffer layer) which is deposited on the anode [indium-tin oxide (ITO)] by spin-coating and subsequently subjected to a thermal treatment (annealing) at 150° C. for 20 minutes. Also said solution is used in conventional dispersed heterojunction (bulk heterojunction) organic solar cells [including poly(3-hexylthiophene) (P3HT) and fullerene] and cannot be used in inverted organic solar cells due to the same drawbacks above described. Furthermore, the aforementioned thermal treatment (annealing) is carried out at a temperature that is not compatible with the use of flexible plastic supports and takes a too long time for a high-speed deposition process (10 m-50 m per minute).

Murase S. et al., in "*Advanced Materials*" (2012), Vol. 24, pg. 2459-2462, describe the use of a $MoO_3$ solution obtained by thermal decomposition, in deionized water, of ammonium heptamolybdate as precursor, in order to create an anodic interlayer (buffer layer) which is deposited on the anode [indium-tin oxide (ITO)] by spin-coating. Also in this case the solution is used in conventional organic solar cells (i.e. not with inverted structure) due to the wettability problems of the active layer.

Hammond S. R. et al., in "*Journal of Materials Chemistry*" (2012), Vol. 22, pg. 3249-3254, describe the use of a molybdenum oxide ($MoO_x$) solution obtained by thermal decomposition, in acetonitrile, of molybdenum tricarbonyl trispropionitrile as precursor, in order to create an anodic interlayer (buffer layer) which is deposited on the anode [indium-tin oxide (ITO)] by spin-coating. The acetonitrile solution of molybdenum tricarbonyl trispropionitrile is prepared in an inert atmosphere due to the instability of said precursor. Said instability, the very high cost of the precursor and the known toxicity of the metal-carbonyl derivatives, make the process described therein unsuitable for use in a large-scale industrial process.

Zilberg K. et al., in "*Applied Materials & Interfaces*" (2012), Vol. 4, pg. 1164-1168, describe the use of a $MoO_x$ solution obtained by thermal decomposition, in iso-propanol (containing about 0.1% water), of bis(2,4-pentandionate) molybdenum (IV) dioxide as precursor, in order to create an anodic interlayer (buffer layer) which is deposited on the anode (Ag) by spin-coating and is subsequently subjected to a thermal treatment (annealing) at 110° C., for 1 hour. These times are completely incompatible with a high speed deposition process (10 m-50 m per minute).

Zhu Y. et al., in "*Journal o fMaterials Chemistry A*" (2014), Vol. 2, pg. 1436-1442, describe the use of a solution of phosphomolybdic acid (PMA), in iso-propanol, in order to create an anodic interlayer (buffer layer) which is deposited on the anode (Ag) by spin-coating and subsequently it is subjected to a thermal treatment (annealing) at 150° C., for 90 minutes. The inverted organic solar cells comprising said interlayer are said to have efficiencies comparable or slightly higher than those of the inverted solar cells comprising an anodic interlayer (buffer layer) obtained through a molybdenum oxide deposition process carried out by evaporation of said molybdenum oxide. However, the long times of said thermal treatment are not compatible with roll-to-roll (R2R) molding process.

Chinese patent application CN103400941 relates to an organic solar cell based on a modified anodic layer comprising: a cathode, a modified cathodic interlayer (buffer layer), one active layer with dispersed heterojunction (bulk heterojunction), a modified anodic interlayer (buffer layer) and an anode; where said modified anodic interlayer (buffer layer) is based on a heteropolyacid having formula $H_x(MM'_{12}OR_{40})$ wherein M is phosphorus (P) or silicon (Si), M' is molybdenum (Mo) or tungsten (W), X is 3 or 4; the cathode is indium tin oxide (ITO); the modified anodic interlayer (buffer layer) is zinc oxide; the active layer with bulk heterojunction is a mixture compounds such as poly (3-hexylthiophene) (P3HT) and fullerenes; the anode is silver or aluminum.

Vasilopoulou M. et al., in "*Journal of the American Chemical Society*" (2015), Vol. 137 (21), pg. 6844-6856, describe the use of Keggin and Dawson-type polyoxymetallates (POMs) as cathodic interlayers (buffer layers) in high efficiency optoelectronic devices. Said cathodic buffer layers have the function of electron transport materials and hole blockers.

Kim J.-H. et al., in "*Electronic Materials Letters*" (2016), Vol. 12, No. 3, pg. 383-387, describe an inverted organic solar cell based on P3HT:PCBM having an improved charge transport thanks to the use of molybdenum oxide nanoparticles ($MoO_3$ NPs) as a hole transporting interlayer positioned between the active layer P3HT:PCBM and the anodic interlayer of PEDOT:PSS [poly(3,4-ethylenedioxythiophene):polystyrene sulfonate]. Said organic solar cell has a photoelectric conversion efficiency (power conversion efficiency—PCE) ($\eta$) equal to 4.11% higher than that of an organic solar cell without the aforementioned hole transporting interlayer of molybdenum oxide nanoparticles ($MoO_3$ NPs) which is, in fact, equal to 3.70%.

The Applicant has noted that, in addition to the aforementioned drawbacks, the adhesion between the different layers of the inverted polymer photovoltaic cells (or solar cells) and, in particular, the adhesion between the active layer and the anodic interlayer (buffer layer), it is often poor.

Consequently, the Applicant faced the problem of finding an inverted polymer photovoltaic cell (or solar cell) having good performance and a good level of adhesion between the different layers, more particularly between the active layer and the anodic interlayer (buffer layer) while maintaining good values of photoelectric conversion efficiency (power conversion efficiency—PCE) ($\eta$).

SUMMARY

The Applicant has now found that the use of a first anodic interlayer (buffer layer) based on PEDOT:PSS [poly(3,4-ethylenedioxythiophene):polystyrene sulfonate] and of a second anodic interlayer (buffer layer), wherein said second anodic interlayer (buffer layer) comprises at least one heteropolyacid and, optionally, at least one amino compound, allows to obtain an inverted polymer photovoltaic cell (or solar cell) having good performance. In particular, the Applicant has now found that the use of said first anodic interlayer (buffer layer) and second anodic interlayer (buffer layer), allows to obtain an inverted polymer photovoltaic cell (or solar cell) having not only good values of photoelectric conversion efficiency (power conversion efficiency—PCE) ($\eta$) but also a good level of adhesion between the different layers, more in particular between the active layer and said first anodic interlayer (buffer layer).

Therefore, the present disclosure provides an inverted polymer photovoltaic cell (or solar cell) comprising:
- an anode;
- a first anodic interlayer (buffer layer) based on PEDOT: PSS [poly(3,4-ethylenedioxythiophene):polystyrene sulfonate];
- an active layer comprising at least one photoactive organic polymer as an electron donor and at least one electron acceptor organic compound;
- a cathodic interlayer (buffer layer);
- a cathode;

wherein a second anodic interlayer (buffer layer) comprising at least one heteropolyacid and, optionally, at least one amino compound is placed between said first anodic interlayer (buffer layer) and said active layer.

For the purpose of the present description and of the following claims, the definitions of the numerical ranges always include the extremes unless otherwise specified.

For the purpose of the present description and of the following claims, the terms first anodic interlayer (buffer layer) and second anodic interlayer (buffer layer) are to be understood as indicated as a simple order of description and not as an order of deposition during the process for the preparation of said inverted polymer photovoltaic cell (or solar cell) described below.

In accordance with a preferred embodiment of the present disclosure, said anode can be made of a metal, said metal being preferably selected, for example, from silver (Ag), gold (Au), aluminum (Al); or it can consist of grids in conductive material, said conductive material being preferably selected, for example, from silver (Ag), copper (Cu), graphite, graphene, and of a transparent conductive polymer, said transparent conductive polymer being, preferably, PEDOT:PSS [poly(3,4-ethylenedioxythiophene):polystyrene sulfonate]; or it can consist of an ink based on metal nanowires, said metal being preferably selected, for example, from silver (Ag), copper (Cu).

Said anode can be obtained by depositing said metal on top of said first anodic interlayer (buffer layer) through the deposition techniques known in the art such as, for example, vacuum evaporation, flexographic printing, knife-over-edge-coating, spray-coating, screen-printing. Alternatively, said anode can be obtained by depositing, above said first anodic interlayer (buffer layer), said transparent conductive polymer via spin coating, or gravure printing, or flexographic printing, or slot die coating, followed by deposition of said grids in conductive material via evaporation, or screen-printing, or spray-coating, or flexographic printing. Alternatively, said anode can be obtained by depositing, above said first anodic interlayer (buffer layer), of said ink based on metal nanowires via spin coating, or gravure printing, or flexographic printing, or slot die coating.

Dispersions or solutions of PEDOT:PSS [poly(3,4-ethylenedioxy-thiophene):polystyrene sulfonate] which can be advantageously used for the purpose of the present disclosure and which are currently commercially available are the products Clevios™ from Heraeus, Orgacon™ from Agfa.

In order to improve the deposition and the properties of said first anodic interlayer (buffer layer), one or more additives can be added to said dispersions or solutions, such as, for example: polar solvents such as, for example, alcohols (for example, methanol, ethanol, propanol), dimethyl sulfoxide, or mixtures thereof; anionic surfactants such as, for example, carboxylates, sulfonated α-olefins, sulfonated alkyl benzenes, alkyl sulfonates, esters of alkyl ether sulfonates, triethanolamines alkyl sulfonates, or mixtures thereof; cationic surfactants such as, for example, alkyltrimethylammonium salts, dialkyldimethylammonium chlorides, alkylpyridinium chlorides, or mixtures thereof; ampholytic surfactants such as, for example, alkylcarboxybetaines, or mixtures thereof; non-ionic surfactants such as, for example, carboxylic diethanolamides, polyoxyethylene alkyl ethers, polyoxyethylene alkyl phenyl ethers, or mixtures thereof; polar compounds (for example, imidazole), or mixtures thereof; or mixtures thereof. More details regarding the addition of said additives can be found, for example, in: Synooka O. et al., "*ACS AppliedMaterials & Interfaces*"

(2014), Vol. 6 (14), pg. 11068-11081; Fang G. et al., "*Macromolecular Chemistry and Physics*" (2011), Vol. 12, Issue 17, pg. 1846-1851.

Said first anodic interlayer (buffer layer) can be obtained by depositing the PEDOT:PSS [poly(3,4-ethylenedioxythiophene):polystyrene sulfonate], in the form of dispersion or solution, above the anode through the deposition techniques known in the art such as, for example, vacuum evaporation, spin coating, drop casting, doctor blade casting, slot die coating, gravure printing, flexographic printing, knife-over-edge-coating, spray-coating, and screen-printing.

According to a preferred embodiment of the present disclosure, said photoactive organic polymer can be selected, for example, from:

(a) polythiophenes such as, for example, regioregular poly(3-hexylthiophene) (P3HT), poly(3-octylthiophene), poly(3,4-ethylenedioxythiophene), or mixtures thereof;

(b) alternating or statistical conjugated copolymers comprising:
    at least one benzotriazole (B) unit having general formula (Ia) or (Ib):

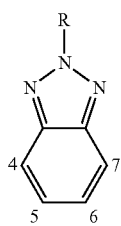

(Ia)

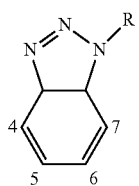

(Ib)

wherein group R is selected from alkyl groups, aryl groups, acyl groups, thioacyl groups, said alkyl, aryl, acyl and thioacyl groups being optionally substituted;

at least one conjugate structural unit (A), wherein each unit (B) is connected to at least one unit (A) in any one of the positions 4, 5, 6, or 7, preferably in the positions 4 or 7;

(c) alternating conjugated copolymers comprising benzothiadiazole units such as, for example, PCDTBT {poly [N-9"-heptadecanyl-2,7-carbazole-alt-5,5-(4',7'-di-2-thienyl-2',1',3'-benzothiadiazole)]}, PCPDTBT {poly [2,6-(4,4-bis-(2-ethylhexyl)-4H-cyclopenta[2,1-b;3,4-b']dithiophene)-alt-4,7(2,1,3-benzothiadiazole)]};

(d) alternating conjugated copolymers comprising thieno [3,4-b]pyrazidine units;

(e) alternating conjugated copolymers comprising quinoxaline units;

(f) alternating conjugated copolymers comprising monomer silol units such as, for example, copolymers of 9,9-dialkyl-9-silafluorene;

(g) alternating conjugated copolymers comprising condensed thiophene units such as, for example, copolymers of thieno[3,4-b]thiophene and of benzo[1,2-b:4,5-b']dithiophene;

(h) alternating conjugated copolymers comprising benzothiadiazole or naphthothiadiazole units substituted with at least one fluorine atom and thiophene units substituted with at least one fluorine atom such as, for example, PffBT4T-2OD {poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)]}, PBTff4T-2OD {poly[(2,1,3-benzothiadiazole-4,7-diyl)-alt-4',3''-difluoro-3,3'''-di(2-octyldodecyl)-2,2';5',2'';5'',2'''-quaterthiophene-5,5'''-diyl)]}, PNT4T-2OD {poly(naphtho[1,2-c:5,-c']bis[1,2,5]thiadiazole-5,10-diyl)-alt-(3,3'''-di(2-octyldodecyl)-2,2';5',2''; 5'',2'''-quaterthiophene-5,5'''-diyl)]};

(i) conjugated copolymers comprising thieno[3,4-c]pyrrole-4,6-dione units such as, for example, PBDTTPD {poly[[5-(2-ethylhexyl)-5,6-dihydro-4,6-dioxo-4H-thieno[3,4-c]pyrrole-1,3-diyl][4,8-bis[(2-ethylhexyl) oxy]benzo[1,2-b:4,5-b']dithiophene-2,6-diyl]};

(l) conjugated copolymers comprising thienothiophene units such as, for example, PTB7 {poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b] thiophenediyl]]}, PBDB-T polymer {poly[[4,8-bis[5-(2-ethylhexyl)-2-thienyl]benzo[1,2-b:4,5-b'] dithiophene-2,6-diyl]-2,5-thiophenediyl[5,7-bis(2-ethylhexyl)-4,8-dioxo-4H,8H-benzo[1,2-c:4,5-c'] dithiophene-1,3-diyl]-2,5-thiophenediyl]};

(m) polymers comprising a derivative of indacen-4-one having general formula (III), (IV) or (V):

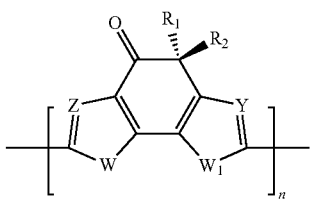

(III)

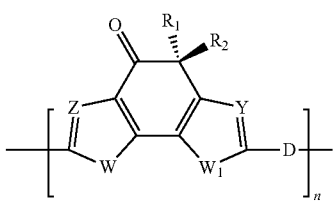

(IV)

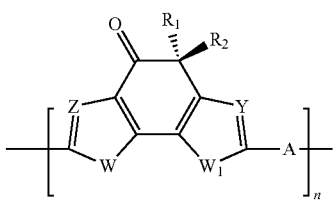

(V)

wherein:
W and $W_1$, identical to or different from each other, preferably identical to each other, represent an oxygen atom; a sulfur atom; an N—$R_3$ group wherein $R_3$ represents a hydrogen atom, or is selected from $C_1$-$C_{20}$, preferably $C_2$-$C_{10}$, linear or branched alkyl groups;

Z and Y, identical to or different from each other, preferably identical to each other, represent a nitrogen atom; or a C—$R_4$ group wherein $R_4$ represents a hydrogen atom, or is selected from $C_1$-$C_{20}$, preferably $C_2$-$C_{10}$, linear or branched alkyl groups, optionally substituted cycloalkyl groups, optionally substituted aryl groups, optionally substituted heteroaryl groups, $C_1$-$C_{20}$, preferably $C_2$-$C_{10}$, linear or branched alkoxy groups, polyethyleneoxylic groups $R_5$—O—[$CH_2$—$CH_2$—O]$_n$— wherein $R_5$ is selected from $C_1$-$C_{20}$, preferably $C_2$-$C_{10}$, linear or branched alkyl groups, and n is an integer between 1 and 4, —$R_6$—$OR_7$ groups wherein $R_6$ is selected from $C_1$-$C_{20}$, preferably $C_2$-$C_{10}$, linear or branched alkylene groups and $R_7$ represents a hydrogen atom or is selected from $C_1$-$C_{20}$, preferably $C_2$-$C_{10}$, linear or branched alkyl groups, or is selected from polyethyleneoxylic groups $R_5$—[—$OCH_2$—$CH_2$—]$_n$— wherein $R_5$ has the same meanings reported above and n is an integer between 1 and 4, —$COR_8$ groups wherein $R_6$ is selected from $C_1$-$C_{20}$, preferably $C_2$-$C_{10}$, linear or branched alkyl groups, —$COOR_9$ groups wherein $R_9$ is selected from $C_1$-$C_{20}$, preferably $C_2$-$C_{10}$, linear or branched alkyl groups; or they represent a —CHO group, or a cyano group (—CN);

$R_1$ and $R_2$, identical to or different from each other, preferably identical to each other, are selected from $C_1$-$C_{20}$, preferably $C_2$-$C_{10}$, linear or branched alkyl groups; optionally substituted cycloalkyl groups; optionally substituted aryl groups; optionally substituted heteroaryl groups; $C_1$-$C_{20}$, preferably $C_2$-$C_{10}$, linear or branched alkoxy groups; polyethyleneoxylic groups $R_5$—O—[$CH_2$—$CH_2$—O]$_n$— wherein $R_5$ has the same meanings reported above and n is an integer between 1 and 4; groups —$R_6$—$OR_7$ wherein $R_6$ and $R_7$ have the same meanings reported above; —$COR_8$ groups wherein $R_8$ has the same meanings reported above; —$COOR_9$ groups wherein $R_9$ has the same meanings reported above; or they represent a —CHO group, or a cyano group (—CN);

D represents an electron donor group;

A represents an electron acceptor group;

n is an integer between 10 and 500, preferably between 20 and 300;

(n) polymers comprising antradithiophene derivatives having general formula (X)

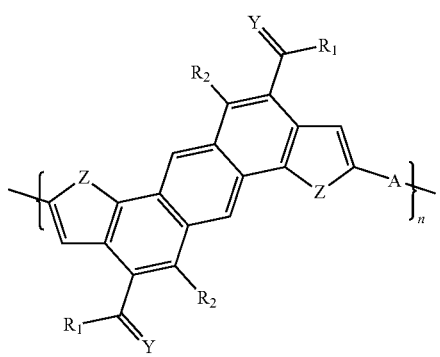

(X)

wherein:

Z, identical to or different from each other, preferably identical to each other, represent a sulfur atom, an oxygen atom, a selenium atom;

Y, identical to or different from each other, preferably identical to each other, represent a sulfur atom, an oxygen atom, a selenium atom;

$R_1$, identical or different from each other, preferably identical to each other, are selected from amino groups —N—$R_3R_4$ wherein $R_3$ represents a hydrogen atom, or is selected from $C_1$-$C_{20}$, preferably $C_2$-$C_{10}$, linear or branched alkyl groups, or is selected from optionally substituted cycloalkyl groups and $R_4$ is selected from $C_1$-$C_{20}$, preferably $C_2$-$C_{10}$, linear or branched alkyl groups, or is selected from optionally substituted cycloalkyl groups; or are selected from $C_1$-$C_{30}$, preferably $C_2$-$C_{20}$, linear or branched alkoxy groups; or are selected from polyethyleneoxylic groups $R_5$—O—[$CH_2$—$CH_2$—O]$_n$— wherein $R_5$ is selected from $C_1$-$C_{20}$, preferably $C_2$-$C_{10}$, linear or branched alkyl groups, and n is an integer between 1 and 4; or are selected from —$R_6$—$OR_7$ groups wherein $R_6$ is selected from $C_1$-$C_{20}$, preferably $C_2$-$C_{10}$, linear or branched alkylene groups and $R_7$ represents a hydrogen atom, or is selected from $C_1$-$C_{20}$, preferably $C_2$-$C_{10}$, linear or branched alkyl groups, or is selected from polyethyleneoxyl groups $R_5$—[—$OCH_2$—$CH_2$—]$_n$— wherein $R_5$ has the same meanings reported above and n is an integer between 1 and 4; or are selected from thiol groups —S—$R_8$ wherein $R_8$ is selected from $C_1$-$C_{20}$, preferably $C_2$-$C_{10}$, linear or branched alkyl groups;

$R_2$, identical to or different from each other, preferably identical to each other, represent a hydrogen atom; or are selected from $C_1$-$C_{20}$, preferably $C_2$-$C_{10}$, linear or branched alkyl groups; or are selected from —$COR_9$ groups wherein $R_9$ is selected from $C_1$-$C_{20}$, preferably $C_2$-$C_{10}$, linear or branched alkyl groups; or are selected from —$COOR_{10}$ groups wherein $R_{10}$ is selected from $C_1$-$C_{20}$, preferably $C_2$-$C_{10}$, linear or branched alkyl groups; or are selected from optionally substituted aryl groups; or are selected from optionally substituted heteroaryl groups;

A represents an electron acceptor group;

n is an integer between 10 and 500, preferably between 20 and 300.

More details related to alternating or statistical conjugated copolymers (b) comprising at least one benzotriazole unit (B) and at least one conjugated structural unit (A) and the process for their preparation can be found, for example, in the international patent application WO 2010/046114 in the name of the Applicant.

More details related to alternating conjugated copolymers comprising benzothiodiazoles units (c), alternating conjugated copolymers comprising thieno [3,4-b]pyrazidine units (d), alternating conjugated copolymers comprising quinoxaline units (e), alternating conjugated copolymers comprising silol monomer units (f), alternating conjugated copolymers comprising thiophene condensate units (g), can be found, for example, in Chen J. et al., *Accounts of chemical research* (2009), Vol. 42, No. 11, pg. 1709-1718; Po' R. et al., "*Macromolecules*" (2015), Vol. 48 (3), pg. 453-461.

More details related to alternating conjugated copolymers comprising benzothiodiazole or naphthothiadiazole units substituted with at least one fluorine atom and thiophene units substituted with at least one fluorine atom (h) can be found, for example, in Liu Y. et al., "*Nature Communications*" (2014), Vol. 5, Paper no. 5293 (DOI:10.1038/ncomms6293).

More details related to conjugated copolymers comprising thieno[3,4-c]pyrrole-4,6-dione units (i) can be found, for example, in Pan H. et al, "*Chinese Chemical Letters*" (2016), Vol 27, Issue 8, pg. 1277-1282.

More details related to conjugated copolymers comprising thienothiophene units (1) can be found, for example, in Liang Y. et al., "*Journal of the American Chemical Society*" (2009), Vol. 131 (22), pg. 7792-7799; Liang Y. et al., "*Accounts of Chemical Research*" (2010), Vol. 43 (9), pg. 1227-1236.

More details related to polymers comprising a derivative of indacen-4-one (m) can be found, for example, in the international patent application WO 2016/180988 in the name of the Applicant.

More related details to polymers comprising antradithiophene derivatives having general formula (X) (n) can be found, for example, in the international patent application WO 2019/175367 in the name of the Applicant.

In accordance with a particularly preferred embodiment of the present disclosure, said photoactive organic polymer can be selected, for example, from PffBT4T-2OD {poly[(5,6-difluoro-2,1,3-benzothiadiazol-4,7-diyl)-alt-(3,3'''-di(2-octyldodecyl)-2,2';5',2'';5'',2'''-quaterthiophen-5,5'''-diyl)]}, PBDTTPD {poly[[5-(2-ethylhexyl)-5,6-dihydro-4,6-dioxo-4H-thieno[3,4-c]pyrrole-1,3-diyl)[4,8-bis[(2-ethylhexyl)oxy]benzo[1,2-b:4,5-b']dithiophene-2,6-diyl]}, PTB7 {poly[[4,8-bis[(2-ethylhexyl)oxy]benzo[11,2-b:4,5-b']dithiophene-2,6-diyl][3-fluoro-2-[(2-ethylhexyl)carbonyl]thieno[3,4-b]thiophenediyl]]}, PBDB-T {poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]]}, polymers comprising antradithiophene derivatives having general formula (X). Polymers comprising antradithiophene derivatives having general formula (X) are preferred.

In accordance with a preferred embodiment of the present disclosure, said organic electron acceptor compound can be selected, for example, from derivatives of fullerene such as, for example, [6,6]-phenyl-Ci-butyric acid methyl ester (PCBM), [6,6]-phenyl-$C_{71}$-butyric acid methyl ester ($PC_{71}BM$), indene-$C_{60}$ bis-adduct (ICBA), bis(1-[3-(methoxycarbonyl)propyl]-1-phenyl)-[6,6]$C_{62}$ (Bis-PCBM). [6,6]-Phenyl-$C_{61}$-butyric acid methyl ester (PCBM), [6,6]-Phenyl-$C_{71}$-butyric acid methyl ester ($PC_{71}BM$), are preferred.

In accordance with a further preferred embodiment of the present disclosure, said organic electron acceptor compound can be selected, for example, from non-fullerene compounds, optionally polymeric, such as, for example, compounds based on perylene-diimides or naphthalene-diimides and fused aromatic rings; indacenothiophenes with electron-poor terminal groups; compounds having an aromatic core capable of symmetrically rotating, for example, derivatives of corannulene or truxenone. 3,9-Bis{2-methylene-[3-(1,1-dicyanomethylene)-indanone]}-5,5,11,11-tetrakis(4-hexylphenyl)-dithieno[2,3-d:2',3'-d']-s-indacene[1,2-b:5,6-b']-dithiophene, poly{[N,N-bis(2-octyldodecyl)-1,4,5,8-naphthalenediimide-2,6-diyl]-alt-5,5'-(2,2'-bithiophene)}, are preferred.

More details relating to said non-fullerene compounds can be found, for example, in Nielsen C. B. et al., "*Accounts of Chemical Research*" (2015), Vol. 48, pg. 2803-2812; Zhan C. et al, "*RSC Advances*" (2015), Vol. 5, pg. 93002-93026.

Said active layer can be obtained by depositing, above said cathodic interlayer (buffer layer), a solution comprising at least one photoactive organic polymer and at least one organic electron acceptor compound, selected from those reported above, using suitable deposition techniques such as, for example, spin-coating, spray-coating, ink-jet printing, slot die coating, gravure printing, screen printing.

According to a preferred embodiment of the present disclosure, said cathodic interlayer (buffer layer) can comprise zinc oxide, titanium oxide, preferably zinc oxide.

Said cathodic interlayer (buffer layer) can be obtained by depositing a precursor solution of zinc oxide on said cathode by means of deposition techniques known in the art such as, for example, vacuum evaporation, spin-coating, drop casting, doctor blade casting, slot die coating, gravure printing, flexographic printing, knife-over-edge-coating, spray-coating, screen-printing.

More details in relation to the formation of said cathodic interlayer (buffer layer) starting from a precursor solution of zinc oxide can be found, for example, in Pó R. et al., "*Energy & Environmental Science*" (2014), Vol. 7, pg. 925-943.

According to a preferred embodiment of the present disclosure, said cathode can be of a material selected, for example, from: indium-tin oxide (ITO), fluorine-doped tin oxide (FTO), zinc oxide doped with aluminum (AZO), zinc oxide doped with gadolinium oxide (GZO); or it can consist of grids in conductive material, said conductive material being preferably selected, for example, from silver (Ag), copper (Cu), graphite, graphene, and a of transparent conductive polymer, said transparent conductive polymer being, preferably, PEDOT:PSS [poly(3,4-ethylenedioxythiophene):polystyrene sulfonate]; or it can consist of an ink based on metal nanowires, said metal being preferably selected, for example, from silver (Ag), copper (Cu).

Said cathode can be obtained by means of techniques known in the art such as, for example, sputtering, electron beam assisted deposition. Alternatively, said cathode can be obtained by depositing said transparent conductive polymer via spin coating, or gravure printing, or flexographic printing, or slot die coating, preceded by the deposition of said grids in conductive material via evaporation, or screen-printing, or spray-coating, or flexographic printing. Alternatively, said cathode can be obtained by depositing said ink based on metal nanowires via spin coating, or gravure printing, or flexographic printing, or slot die coating. The deposition can take place on the support layer selected from those reported below.

In accordance with a preferred embodiment of the present disclosure, said cathode can be associated with a support layer which can be of transparent rigid material such as, for example, glass, or of flexible material such as, for example, polyethylene terephthalate (PET), polyethylene naphthalate (PEN), polyethylene imine (PI), polycarbonate (PC), polypropylene (PP), polyimide (PI), triacetyl cellulose (TAC), or copolymers thereof.

In accordance with a preferred embodiment of the present disclosure, said at least one heteropolyacid can be selected, for example, from heteropolyacids having general formula (I):

$$H_x[A(MO_3)_yO_z] \qquad (I)$$

wherein:
A represents a silicon atom, or a phosphorus atom;
M represents an atom of a transition metal belonging to group 5 or 6 of the Periodic Table of the Elements, preferably selected from molybdenum, tungsten;
x is an integer that depends on the valence of A, preferably is 3 or 4;
y is 12 or 18;
z is 4 or 6.

In accordance with a further preferred embodiment of the present disclosure, said at least one heteropolyacid can be selected, for example, from heteropolyacids having general formula (II):

 (II)

wherein:
A represents a silicon atom, or a phosphorus atom;
x is an integer that depends on the valence di A, preferably is 3 or 4;
p is 6 or 10;
q is 2 or 6.

For the purpose of the present disclosure, said heteropolyacids having general formula (I) and said heteropolyacids having general formula (II) can be used in hydrated form, or in alcoholic solution (for example, in ethanol, iso-propanol, or mixtures thereof).

In accordance with a preferred embodiment of the present disclosure, said heteropolyacids having general formula (I) and said heteropolyacids having general formula (II) can be selected, for example, from: hydrated phosphomolybdic acid $\{H_3[P(MoO_3)_{12}O_4]\cdot nH_2O\}$, phosphomolybdic acid $\{H_3[P(MoO_3)_{12}O_4]\}$ in alcoholic solution, hydrated phosphotungstic acid $\{H_3[P(WO_3)_{12}O_4]\cdot nH_2O\}$, phosphotungstic acid in alcoholic solution $\{H_3[P(WO_3)_{12}O_4]\}$, hydrated silicomolybdic acid $\{H_4[Si(MoO_3)_{12}O_4]\cdot nH_2O\}$, silicomolybdic acid $\{H_4[Si(MoO_3)_{12}O_4]\}$ in alcoholic solution, hydrated silicotungstic acid $\{H_4[Si(WO_3)_{12}O_4]\cdot nH_2O\}$, silicotungstic acid $\{H_4[Si(WO_3)_{12}O_4]\}$ in alcoholic solution, hydrated phosphomolybdovanadic acid $\{H_3[P(Mo)_6(V)_6 O_{40}]\cdot nH_2O\}$, phosphomolybdovanadic acid $\{H_3[P(Mo)_6 (V)_6 O_{40}]\}$ in alcoholic solution, hydrated phosphomolybdovanadic acid $\{H_3[P(Mo)_{10}(V)_2O_{40}]\cdot nH_2O\}$, phosphomolybdovanadic acid $\{H_3[P(Mo)_{10}(V)_2O_{40}]\}$ in alcoholic solution or mixtures thereof. Hydrated phosphomolybdic acid $\{H_3[P(MoO_3)_{12}O_4]\cdot nH_2O\}$, phosphomolybdic acid $\{H_3[P(MoO_3)_{12}O_4]\}$ in alcoholic solution, hydrated silicotungstic acid $\{H_4[Si(WO_3)_{12}O_4]\cdot nH_2O\}$, are preferred.

Heteropolyacids having general formula (I) or (II) are commercially available, or they can be prepared according to processes known in the art as described, for example, in American patents U.S. Pat. Nos. 4,146,574 and 5,792,721, or by Odyakov V. F. et al., in "*Applied Catalysis A General*" (2008), Vol. 342 (1), pg. 126-130.

In accordance with a preferred embodiment of the present disclosure, said amino compound can be selected, for example, from:
low molecular weight aliphatic amines, containing from 8 to 24 carbon atoms, linear or branched, primary, secondary or tertiary, such as, for example, n-octylamine, n-dodecylamine, n-hexadecylamine, di-n-octylamine, or mixture thereof;
conjugated polymers containing chain or side amino groups such as, for example, poly[bis(4-phenyl)(2,4,6-trimethylphenyl)amine](PTAA), poly(N,N-bis-4-butylphenyl-N,N-bisphenyl)benzidine (polyTPD), poly[(9,9-bis(3'-(N,N-dimethylamino)propyl)-2,7-fluorene)-alt-2,7-(9,9-dioctyl-fluorene)](PFN), or mixtures thereof,
or mixtures thereof.

Said second anodic interlayer (buffer layer) can be obtained by depositing an alcoholic solution of said at least one heteropolyacid on top of the active layer, by means of deposition techniques known in the art such as, for example, vacuum evaporation, spin coating, drop casting, doctor blade casting, slot die coating, gravure printing, flexographic printing, knife-over-edge-coating, spray-coating, screen-printing, adjusting from time to time the rheological parameters of said at least one heteropolyacid in the form of a solution (for example, viscosity) according to the requirements of the deposition technique used.

In the event that said second anodic interlayer (buffer layer) also comprises at least one amino compound, said second interlayer (buffer layer) can also be obtained by depositing a solution of said at least one heteropolyacid and said at least one amino compound, in an ethereal solvent such as, for example, tetrahydrofuran, dioxane, or in a hydrocarbon solvent such as, for example, xylene, toluene, operating as described above in the case of an alcoholic solution of said at least one heteropolyacid.

As mentioned above, the anode, the cathode, the first anodic interlayer (buffer layer), the second anodic interlayer (buffer layer) and the cathodic interlayer (buffer layer) present in the aforementioned inverted polymer photovoltaic cell (or solar cell), can be deposited by means of techniques known in the art. More details regarding these techniques can be found, for example in: Pó R. et al., "*Interfacial Layers*", in "*Organic Solar Cells—Fundamentals, Devices, and Upscaling*" (2014), Chapter 4, Richter H. and Rand B. Eds., Pan Stanford Publishing Pte Ltd.; Yoo S. et al, "*Electrodes in Organic Photovoltaic Cells*," in "*Organic Solar Cells—Fundamentals, Devices, and Upscaling*" (2014), Chapter 5, Richter H. and Rand B. Eds., Pan Stanford Publishing Pte Ltd.; Angmo D. et al., "*Journal of Applied Polymer Science*" (2013), Vol. 129, Issue 1, pg. 1-14.

As stated above, the present disclosure also relates to a process for the preparation of the aforementioned inverted polymer photovoltaic cell (or solar cell).

In accordance with a preferred embodiment of the present disclosure, the process for the preparation of the inverted polymer photovoltaic cell (or solar cell) comprises:
forming the cathode by sputtering; or by electron beam assisted deposition; or by depositing a transparent conductive polymer via spin coating, or gravure printing, or flexographic printing, or slot die coating, preceded by deposition of grids in conductive material via evaporation, or screen-printing, or spray-coating, or flexographic printing; or by depositing an ink based on metal nanowires via spin coating, or gravure printing, or flexographic printing, or slot die coating;
forming the cathodic interlayer (buffer layer) by spin coating, or gravure printing, or flexographic printing, or slot die coating above said cathode;
forming the active layer by spin coating, or gravure printing, or slot-die coating, above said cathodic interlayer (buffer layer);
forming the second anodic interlayer (buffer layer) by spin coating, or gravure printing, or screen-printing, or flexographic printing, or slot-die coating above said active layer;
forming the first anodic interlayer (buffer layer) by spin coating, or gravure printing, or screen-printing, or flexographic printing, or slot-die coating, above said second anodic interlayer (buffer layer);
forming the anode by vacuum evaporation, or screen-printing, or spray-coating, or flexographic printing, above said first anodic interlayer (buffer layer); or by deposition of a transparent conductive polymer via spin coating, or gravure printing, or flexographic printing, or slot die coating, followed by deposition of grids in conductive material via evaporation, or screen-printing, or spray-coating, or flexographic printing, above said first anodic interlayer (buffer layer); or by deposition of an ink based on metal nanowires via spin coating, or gravure printing, or flexographic printing, or slot die coating, above said first anodic interlayer (buffer layer).

In accordance with a preferred embodiment of the present disclosure, in the inverted polymer photovoltaic cell (or solar cell) object of the present disclosure:

- the anode can have a thickness ranging between 50 nm and 150 nm, preferably ranging between 80 nm and 120 nm;
- the first anodic interlayer (buffer layer) can have a thickness ranging between 10 nm and 2000 nm, preferably ranging between 15 nm and 1000 nm;
- the second anodic interlayer (buffer layer) can have a thickness ranging between 1 nm and 100 nm, preferably ranging between 2 nm and 40 nm;
- the active layer can have a thickness ranging between 50 nm and 500 nm, preferably ranging between 70 nm and 360 nm;
- the cathodic interlayer (buffer layer) can have a thickness ranging between 10 nm and 100 nm, preferably ranging between 20 nm and 80 nm;
- the cathode can have a thickness ranging between 50 nm and 150 nm, preferably ranging between 80 nm and 120 nm.

BRIEF DESCRIPTION OF THE DRAWINGS

The present disclosure will now be illustrated in greater detail through an embodiment with reference to FIG. 1 below reported which represents a cross-sectional view of an inverted polymer photovoltaic cell (or solar cell) object of the present disclosure.

DETAILED DESCRIPTION OF THE DRAWING AND DISCLOSURE

With reference to FIG. 1, the inverted polymer photovoltaic cell (or solar cell) (1) comprises:

- a transparent support (7), for example, a glass or plastic support;
- a cathode (2), for example an indium tin oxide (ITO) cathode; or a cathode obtained by depositing a transparent conductive polymer via spin coating, or gravure printing, or flexographic printing, or slot die coating, preceded by deposition of grids in conductive material via evaporation, or screen-printing, or spray-coating, or flexographic printing; or a cathode obtained by depositing an ink based on metal nanowires via spin coating, or gravure printing, or flexographic printing, or slot die coating;
- a cathodic interlayer (buffer layer) (3), comprising, for example, zinc oxide;
- a layer of photoactive material (4) comprising at least one photoactive organic polymer, for example, a polymer comprising antradithiophene derivatives having general formula (X) (for example copolymer having formula (Xb) below reported), and at least one derivative of fullerene, for example, [6,6]-phenyl-$C_{71}$-butyric acid methyl ester ($PC_{71}BM$), or at least one non-fullerene compound, optionally polymeric;
- a second anodic interlayer (buffer layer) (5b), comprising an alcohol solution of at least one heteropolyacid having general formula (I) or (II) above reported, for example, phosphomolybdic acid trihydrate; or an alcoholic solution of at least one heteropolyacid having general formula (I) or (II) above reported, for example, phosphomolybdic acid trihydrate and at least one low molecular weight aliphatic amine, for example n-decylamine; or a solution in tetrahydrofuran of at least one heteropolyacid having general formula (I) or (II) above reported, for example, phosphomolybdic acid trihydrate and at least one conjugated polymer containing chain or side amino groups, for example, poly[(9,9-bis(3'-(N,N-dimethylamino)propyl)-2,7-fluorene)-alt-2,7-(9,9-dioctylfluorene)](PFN);
- a first anodic interlayer (buffer layer) (5a), comprising, for example, PEDOT:PSS [poly(3,4-ethylenedioxythiophene):polystyrene sulfonate];
- an anode (6), for example, a silver (Ag) anode; or an anode obtained by depositing a transparent conductive polymer via spin coating, or gravure printing, or flexographic printing, or slot die coating, followed by deposition of grids in conductive material via evaporation, or screen-printing, or spray-coating, or flexographic printing; or an anode obtained by depositing an ink based on metal nanowires via spin coating, gravure printing, flexographic printing, or slot die coating.

In order to better understand the present disclosure and to put it into practice, it is reported below some illustrative and non-limiting examples of the same.

Example 1 (Disclosure)

SOLAR cell with copolymer (Xb):$PC_{71}BM$, phosphomolybdic acid and PEDOT:PSS

A polymer-based device was prepared on a substrate of polyethylene terephthalate (PET) coated with ITO (indium tin oxide) (Fom Technologies—Denmark) (100 nm), previously subjected to a cleaning procedure with a stream of compressed nitrogen and then, by means of an air plasma device (Diener Electronic GmbH & Co.—Germany), immediately before proceeding to the next step.

The substrate thus treated was ready for the deposition of the cathodic interlayer (buffer layer). For this purpose, the zinc oxide interlayer (buffer layer) was obtained starting from a 2.6% by weight solution of zinc oxide nanoparticles (Aldrich) in iso-propanol (Aldrich). The solution was deposited, in the air, on the substrate using a slot-die tool (Roller Coater—FOM Technologies—Denmark) operating under the following conditions:

flow: 30 µl/min;
speed of substrate: 0.5 m/min;
gap: 50 m.

Immediately after deposition of the cathodic interlayer (buffer layer), the formation of zinc oxide was obtained by treating everything thermally at 140° C., for 3 minutes, in a ventilated air oven. The cathodic interlayer (buffer layer) thus obtained had a thickness of 70 nm.

A solution of 14 mg/ml of the copolymer having formula (Xb) obtained as described in Example 6 of the international patent application WO 2019/175367 above reported and 24.5 mg/ml of [6,6]-phenyl-$C_{71}$-butyric acid methyl ester ($PC_{71}BM$) (Nano-C), in o-xylene (Aldrich), was prepared. The active layer was deposited, in the air, starting from the solution thus obtained, using a slot-die tool (Roller Coater of FOM Technologies—Denmark) operating under the following conditions:

flow: 120 µl/min;
speed of substrate: 0.75 m/min;
gap: 50 µm.

Immediately after the deposition of the active layer, everything was thermally treated at 120° C., for 2 minutes, in a ventilated air oven. The active layer thus obtained had a thickness of 300 nm.

Above the active layer thus obtained, the second anodic interlayer (buffer layer) was deposited in the air, starting from a solution of phosphomolybdic acid trihydrate (Aldrich) in iso-propanol (Aldrich) (6 mg/ml) through a slot-die tool (Roller Coater of FOM Technologies—Denmark) operating under the following conditions:

flow: 100 µl/min;
speed of substrate: 0.75 m/min;
gap: 50 µm.

The second anodic interlayer (buffer layer) thus obtained had a thickness of 5 nm.

Above said second anodic interlayer (buffer layer), the first anodic interlayer (buffer layer) was deposited in the air, starting from a suspension comprising PEDOT:PSS [poly(3,4-ethylenedioxythiophene):polystyrene sulfonate](Clevios™ HTL Solar 388—Heraeus Co.) with a concentration of PEDOT:PSS equal to 1.2 mg/ml, using a slot-die tool (Roller Coater of FOM Technologies—Denmark) operating under the following conditions:

flow: 360 µl/min;
speed of substrate: 1 m/min;
gap: 100 µm.

Immediately after the deposition of the first anodic interlayer (buffer layer), everything was thermally treated at 120° C., for 2 minutes, in a ventilated air oven. The first anodic interlayer (buffer layer) thus obtained had a thickness of 150 nm.

Above said first anodic interlayer (buffer layer) the silver (Ag) anode was deposited, having a thickness of 100 nm, by vacuum evaporation, suitably masking the area of the device in order to obtain an active area equal to 0.25 mm$^2$.

The deposition of the anode was carried out in a standard vacuum evaporation chamber containing the substrate and an evaporation vessel equipped with a heating element containing 10 silver (Ag) shots (diameter 1 mm-3 mm) (Aldrich). The evaporation process was carried out under vacuum, at a pressure of about $1 \times 10^{-6}$ bar. The silver (Ag), after evaporation, was condensed in the non-masked parts of the device.

The thicknesses were measured with a Dektak 150 profilometer (Veeco Instruments Inc.).

Measurement of photoelectric conversion efficiency (power conversion efficiency—PCE) ($\eta$) of the obtained device was carried out in a controlled atmosphere (nitrogen) in a glove box at room temperature (25° C.). The current-voltage curves (I-V) were acquired with a Keithley® 2600A multimeter connected to a personal computer for data collection. The photocurrent was measured by exposing the device to the light of an ABET SUN® 2000-4 solar simulator, capable of providing 1.5G AM radiation with an intensity of 100 mW/cm$^2$ (1 sun), measured with a power-meter Ophir Nova® II connected to a 3A-P thermal sensor. The measurement was carried out on 35 devices and the average value of photoelectric conversion efficiency (power conversion efficiency—PCE) ($\eta$) was equal to 7.32%.

In order to establish the level of adhesion, on the semi-finished device after the deposition of the double interlayer, i.e. after the deposition of the second anodic interlayer (buffer layer) and the first anodic interlayer (buffer layer), a rectangle of adhesive tape was applied. The tape was pressed with a finger and then torn off. The tear did not allow the removal of any layers.

Example 2 (Comparative)

Solar Cell with Copolymer (Xb): PC$_{71}$BM and PEDOT:PSS

A polymer-based device was prepared on a substrate of polyethylene terephthalate (PET) coated with ITO (indium tin oxide) (Fom Technologies—Denmark) (100 nm), previously subjected to a cleaning procedure as described in the Example 1.

The deposition of the cathodic interlayer (buffer layer), the deposition of the active layer and the deposition of the first anodic interlayer (buffer layer), were carried out as described in Example 1; the composition of said cathodic interlayer (buffer layer), the composition of said active layer and the composition of said first anodic interlayer (buffer layer), are the same as reported in Example 1; the thickness of said cathodic interlayer (buffer layer), the thickness of said active layer and the thickness of said first anodic interlayer (buffer layer), are the same as reported in Example 1.

Above the obtained active layer, unlike Example 1, the second anodic interlayer (buffer layer) starting from a solution of phosphomolybdic acid trihydrate in iso-propanol was not deposited.

The deposition of the silver anode (Ag) was carried out as described in Example 1: the thickness of said silver anode is the same as reported in Example 1.

The thicknesses were measured with a Dektak 150 profilometer (Veeco Instruments Inc.).

The electrical characterization of the device, the current-voltage curves (I-V) and the photocurrent, were measured as described in Example 1. The measurement was carried out on 35 devices and the average value of photoelectric conversion efficiency (power conversion efficiency—PCE) ($\eta$) was equal to 6.06%.

In order to establish the level of adhesion, on the semi-finished device after the deposition of the first anodic interlayer (buffer layer), a rectangle of adhesive tape was applied. The tape was pressed with a finger and then torn off. The tear allowed the removal of the first anodic interlayer (buffer layer).

Example 3 (Comparative)

Solar Cell with Copolymer (Xb):PC$_{71}$BM and Evaporated Molybdenum Oxide MoO)

A polymer-based device was prepared on a substrate of polyethylene terephthalate (PET) coated with ITO (indium tin oxide) (Fom Technologies—Denmark) (100 nm), previously subjected to a cleaning procedure as described in the Example 1.

The deposition of the cathodic interlayer (buffer layer) and the deposition of the active layer, were carried out as described in Example 1; the composition of said cathodic interlayer (buffer layer) and the composition of said active layer are the same as reported in Example 1; the thickness of said cathodic interlayer (buffer layer) and the thickness of said active layer are the same as reported in Example 1.

Above the obtained active layer, unlike Example 1, neither the first anodic interlayer (buffer layer) starting from a suspension comprising PEDOT:PSS [poly(3,4-ethylenedioxythiophene) polystyrene sulfonate](Clevios™ HTL Solar 388—Heraeus Co.), nor the second anodic interlayer (buffer layer) starting from a solution of phosphomolybdic acid trihydrate in iso-propanol, were deposited.

Above the active layer instead, the anodic interlayer (buffer layer) was deposited, which was obtained by depositing molybdenum oxide (MoO$_3$) (Aldrich) through a thermal process: the thickness of the anodic interlayer (buffer layer) was equal at 10 nm. The silver (Ag) anode, having a thickness of 100 nm, was deposited on the anodic interlayer (buffer layer) by vacuum evaporation, suitably masking the area of the device in order to obtain an active area equal to 0.25 mm².

The anodic interlayer (buffer layer) and the anode depositions were carried out in a standard vacuum evaporation chamber containing the substrate and two evaporation vessels equipped with a heating resistance containing 10 mg of molybdenum oxide ($MoO_3$) powder (Aldrich) and 10 shots of silver (Ag) (diameter 1 mm-3 mm) (Aldrich), respectively. The evaporation process was carried out under vacuum, at a pressure of about $1 \times 10^{-6}$ bar. Molybdenum oxide ($MoO_3$) and silver (Ag), after evaporation, are condensed in the non-masked parts of the device.

The thicknesses were measured with a Dektak 150 profilometer (Veeco Instruments Inc.).

The electrical characterization of the device, the current-voltage curves (I-V) and the photocurrent, were measured as described in Example 1. The measurement was carried out on 35 devices and the average value of photoelectric conversion efficiency (power conversion efficiency—PCE) (η) was 6.74%.

In order toto establish the level of adhesion, on the semi-finished device after the deposition of the anodic interlayer (buffer layer), a rectangle of adhesive tape was applied. The tape was pressed with a finger and then torn off. The tear allowed the removal of the anodic interlayer (buffer layer).

Example 4 (Disclosure)

Solar Cell with Copolymer (Xb):$PC_{71}BM$, Phosphomolybdic Acid/n-Dodecylamine and PEDOT:PSS A polymer-based device was prepared on a substrate of polyethylene terephthalate (PET) coated with ITO (indium tin oxide) (Fom Technologies—Denmark) (100 nm), previously subjected to a cleaning procedure as described in the Example 1.

The deposition of the cathodic interlayer (buffer layer), the deposition of the active layer and the deposition of the first anodic interlayer (buffer layer), were carried out as described in Example 1; the composition of said cathodic interlayer (buffer layer) and the composition of said active layer are the same as reported in Example 1; the thickness of said cathodic interlayer (buffer layer) and the thickness of said active layer are the same as reported in Example 1.

Above the obtained active layer, unlike Example 1, the second anodic interlayer (buffer layer) was deposited starting from a solution of 5.4 mg/ml of phosphomolybdic acid trihydrate and 0.6 mg/ml of n-dodecylamine (Aldrich) in n-propanol: the deposit was carried out as described in Example 1.

The deposition of the silver (Ag) anode was carried out as described in Example 1: the thickness of said silver anode is the same as reported in Example 1.

The thicknesses were measured with a Dektak 150 profilometer (Veeco Instruments Inc.).

The electrical characterization of the device, the current-voltage curves (I-V) and the photocurrent, were measured as described in Example 1. The measurement was carried out on 35 devices and the average value of photoelectric conversion efficiency (power conversion efficiency—PCE)(q) was equal to 5.91%.

In order to establish the level of adhesion, on the semi-finished device after the deposition of the double interlayer, i.e. after the deposition of the second anodic interlayer (buffer layer) and the first anodic interlayer (buffer layer), a rectangle of adhesive tape was applied. The tape was pressed with a finger and then torn off. The tear did not allow the removal of any layers.

Example 5 (Disclosure)

Solar Cell with Copolymer (Xb):$PC_{71}BM$, Phosphomolybdic Acid/PFN and PEDOT:PSS A polymer-based device was prepared on a substrate of polyethylene terephthalate (PET) coated with ITO (indium tin oxide) (Fom Technologies—Denmark) (100 nm), previously subjected to a cleaning procedure as described in the Example 1.

The deposition of the cathodic interlayer (buffer layer), the deposition of the active layer and the deposition of the first anodic interlayer (buffer layer), were carried out as described in Example 1; the composition of said cathodic interlayer (buffer layer) and the composition of said active layer are the same as reported in Example 1; the thickness of said cathodic interlayer (buffer layer) and the thickness of said active layer are the same as reported in Example 1.

On top of the obtained active layer, unlike Example 1, the second anodic interlayer (buffer layer) was deposited starting from a solution of 5.5 mg/ml of phosphomolybdic acid trihydrate and 0.5 mg/ml of poly[(9,9-bis(3'-(N,N-dimethylamino)propyl)-2,7-fluorene)-alt-2,7-(9,9-dioctyl-fluorene)](PFN) (Aldrich) in tetrahydrofuran (Aldrich): the deposit was carried out as described in Example 1.

The deposition of the silver anode (Ag) was carried out as described in Example 1: the thickness of said silver anode is the same as reported in Example 1.

The thicknesses were measured with a Dektak 150 profilometer (Veeco Instruments Inc.).

The electrical characterization of the device, the current-voltage curves (I-V) and the photocurrent, were measured as described in Example 1. The measurement was carried out on 35 devices and the average value of photoelectric conversion efficiency (power conversion efficiency—PCE) (l) was equal to 5.77%.

In order to establish the level of adhesion, on the semi-finished device after the deposition of the double interlayer, i.e. after the deposition of the second anodic interlayer (buffer layer) and the first anodic interlayer (buffer layer), a rectangle of adhesive tape was applied. The tape was pressed with a finger and then torn off. The tear did not allow the removal of any layers.

The invention claimed is:

1. An inverted polymer photovoltaic cell (or solar cell) comprising:
    a cathode;
    a cathodic interlayer (buffer layer)
    an active layer comprising at least one photoactive organic polymer as an electron donor and at least one electron acceptor organic compound;
    a first anodic interlayer (buffer layer) based on PEDOT:PSS [poly(3,4-ethylenedioxythiophene): polystyrene sulfonate];
    an anode;
    wherein a second anodic interlayer (buffer layer) comprising at least one heteropolyacid and at least one amino compound is placed between said first anodic interlayer (buffer layer) and said active layer.

2. The inverted polymer photovoltaic cell (or solar cell) according to claim 1, wherein said anode is made of metal, said metal being selected from silver (Ag), gold (Au), aluminum (Al); or it consists of grids in conductive material, said conductive material being selected from silver (Ag), copper (Cu), graphite, graphene, and of a transparent conductive polymer, said transparent conductive polymer being PEDOT: PSS [poly(3,4-ethylenedioxythiophene): polystyrene sulfonate]; or it consists of metal nanowires, said metal being selected from silver (Ag) and copper (Cu).

3. The inverted polymer photovoltaic cell (or solar cell) according to claim 1, wherein said photoactive organic polymer is selected from:

(a) polythiophenes, selected from regioregular poly(3-hexylthiophene) (P3HT), poly(3-octylthiophene), poly(3,4-ethylenedioxy-thiophene), or mixtures thereof;

(b) alternating or statistical conjugated copolymers comprising:
at least one benzotriazole (B) unit having general formula (Ia) or (Ib):

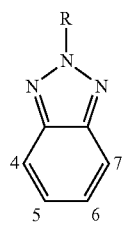

(Ia)

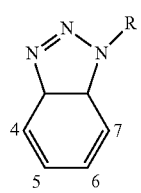

(Ib)

wherein group R is selected from alkyl groups, aryl groups, acyl groups, thioacyl groups, said alkyl, aryl, acyl and thioacyl groups being optionally substituted;

at least one conjugated structural unit (A), wherein each unit (B) is connected to at least one unit (A) in any one of the positions 4, 5, 6, or 7;

(c) alternating conjugated copolymers comprising benzothiadiazole units, selected from PCDTBT {poly [N-9''-heptadecanyl-2,7-carbazole-alt-5,5-(4',7'-di-2-thienyl-2',1',3'-benzothiadiazole)]}, or PCPDTBT {poly [2,6-(4,4-bis-(2-ethylhexyl)-4H-cyclopenta[2,1-b;3,4-b']dithiophene)-alt-4,7 (2,1,3-benzothiadiazole)]};

(d) alternating conjugated copolymers comprising thieno [3,4-b]pyrazine units;

(e) alternating conjugated copolymers comprising quinoxaline units;

(f) alternating conjugated copolymers comprising monomer silol units selected from copolymers of 9,9-dialkyl-9-silafluorene;

(g) alternating conjugated copolymers comprising condensed thiophene units selected from copolymers of thieno [3,4-b]thiophene and of benzo[1,2-b: 4,5-b']dithiophene;

(h) alternating conjugated copolymers comprising benzothiadiazole or naphthothiadiazole units substituted with at least one fluorine atom and thiophene units substituted with at least one fluorine atom selected from PffBT4T-2OD {poly [(5,6-difluoro-2,1,3-benzothiadiazol-4,7-diyl)-alt-(3,3'-di(2-octyldodecyl)-2,2';5',2'';5'',2'''-quaterthiophen-5,5'''-diyl)]}, PBTff4T-2OD {poly [(2,1,3-benzothiadiazole-4,7-diyl)-alt-4',3''-difluoro-3,3'-di(2-octyldodecyl)-2,2',5',2'';5'',2'''-quaterthiophene-5,5'''-diyl)]}, PNT4T-2OD {poly(naphtho[1,2-c: 5,-c']bis[1,2,5]thiadiazole-5,10-diyl)-alt-(3,3'-di(2-octyldodecyl)-2,2';5',2''; 5''',2'-quaterthiophene-5,5''-diyl)]};

(i) conjugated copolymers comprising thieno [3,4-c]pyrrole-4,6-dione units selected from PBDTTPD ({poly [[5-(2-ethylhexyl)-[(5,6-dihydro-4,6-dioxo-4/]-thieno [3,4-c]pyrrole-1,3-diyl) [4,8-bis[(2-ethylhexyl)oxy]benzo[1,2-b: 4,5-b']dithiophene-2,6-diyl]});

(l) conjugated copolymers comprising thienothiophene units-such as selected from PTB7 {poly [4,8-bis[(2-ethylhexyl)oxy]benzo[1,2-b: 4,5-b']dithiophene-2,6-diyl][3-fluoro-2-[(2-ethylhexyl) carbonyl]thieno [3,4-b]thiophenediyl]]}, PBDB-T polymer {poly [[4,8-bis[5-(2-ethylhexyl)-2-thienyl]benzo[1,2-b: 4,5-b']dithiophene-2,6-diyl]-2,5-thiophenediyl[5,7-bis(2-ethylhexyl)-4,8-dioxo-4H,8H-benzo[1,2-c: 4,5-c']dithiophene-1,3-diyl]]};

(m) polymers comprising a derivative of indacen-4-one having general formula (III), (IV) or (V):

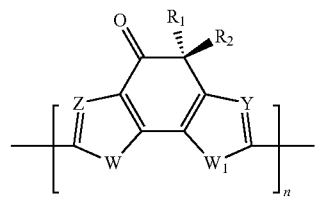

(III)

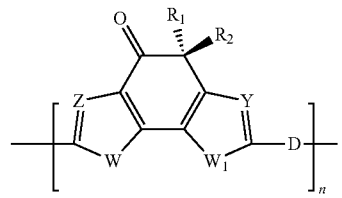

(IV)

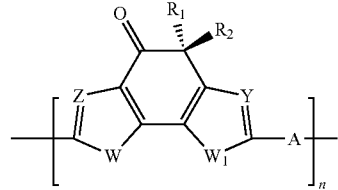

(V)

wherein:
W and $W_1$, identical to or different from each other, represent an oxygen atom; a sulfur atom; an N—$R_3$ group wherein $R_3$ represents a hydrogen atom, or is selected from $C_1$-$C_{20}$, linear or branched alkyl groups;

Z and Y, identical to or different from each other, represent a nitrogen atom; or a $CR_4$ group wherein $R_4$ represents a hydrogen atom, or is selected from $C_1$-$C_{20}$, linear or branched alkyl groups, optionally substituted cycloalkyl groups, optionally substituted aryl groups, optionally substituted heteroaryl groups, $C_1$-$C_{20}$, linear or branched alkoxy groups, polyethyleneoxylic groups $R_5$—O—[$CH_2$—$CH_2$—O]$_n$— wherein $R_5$ is selected from $C_1$-$C_{20}$, linear or branched alkyl groups, and n is an integer between 1 and 4, —$R_6$—$OR_7$ groups wherein $R_6$ is selected from $C_1$-$C_{20}$, linear or branched alkylene groups and $R_7$ represents a hydrogen atom or is selected from $C_1$-$C_{20}$, linear or branched alkyl groups, or is selected from polyethyleneoxylic groups $R_5$—[—OCH$_2$—CH$_2$—]$_n$— wherein $R_5$ has the same meanings reported above and n is an integer between 1 and 4, —COR$_8$ groups wherein $R_8$ is selected from $C_1$-$C_{20}$, linear or branched alkyl groups, —COOR, groups wherein $R_9$ is selected from $C_1$-$C_{20}$, linear or branched alkyl groups; or represent a-CHO group, or a cyano group (—CN);

$R_1$ and $R_2$, identical to or different from each other, are selected from $C_1$-$C_{20}$, linear or branched alkyl groups; optionally substituted cycloalkyl groups; optionally substituted aryl groups; optionally substituted heteroaryl groups; $C_1$-$C_{20}$, linear or branched alkoxy groups; polyethyleneoxylic groups $R_5$—O—[CH$_2$—CH$_2$—O]$_n$— wherein $R_5$ has the same meanings reported above and n is an integer between 1 and 4;

groups —$R_6$—OR$_7$ wherein $R_6$ and $R_7$ have the same meanings reported above; —COR$_8$ groups wherein $R_5$ has the same meanings reported above; —COOR$_9$ groups wherein $R_9$ has the same meanings reported above; or represent a-CHO group, or a cyano group (—CN);

D represents an electron donor group;
A represents an electron acceptor group;
n is an integer between 10 and 500; and (n) polymers comprising antradithiophene derivatives having general formula (X):

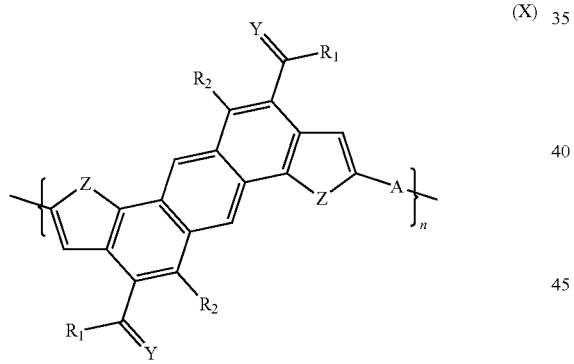

(X)

wherein:
Z, identical to or different from each other, represent a sulfur atom, an oxygen atom, a selenium atom;
Y, identical to or different from each other, represent a sulfur atom, an oxygen atom, a selenium atom;
$R_1$, identical or different from each other, are selected from amino groups —N—$R_3$$R_4$ wherein $R_3$ represents a hydrogen atom, or is selected from $C_1$-$C_{20}$, linear or branched alkyl groups, or is selected from optionally substituted cycloalkyl groups and $R_4$ is selected from $C_1$-$C_{20}$, linear or branched alkyl groups, or is selected from optionally substituted cycloalkyl groups; or are selected from $C_1$-$C_{30}$, linear or branched alkoxy groups; or are selected from polyethyleneoxylic groups $R_5$—O—[CH$_2$—CH$_2$—O]$_n$— wherein $R_5$ is selected from $C_1$-$C_{20}$, linear or branched alkyl groups, and n is an integer between 1 and 4; or are selected from —$R_6$—OR$_7$ groups wherein $R_6$ is selected from $C_1$-$C_{20}$, linear or branched alkylene groups and $R_7$ represents a hydrogen atom, or is selected from $C_1$-$C_{20}$, linear or branched alkyl groups, or is selected from polyethyleneoxyl groups $R_5$—[—OCH$_2$—CH$_2$—]$_n$— wherein $R_5$ has the same meanings reported above and n is an integer between 1 and 4; or are selected from thiol groups —S—$R_5$ wherein Ra is selected from $C_1$-$C_{20}$, linear or branched alkyl groups;

$R_2$, identical to or different from each other, represent a hydrogen atom; or are selected from $C_1$-$C_{20}$, linear or branched alkyl groups; or are selected from —COR$_9$ groups wherein $R_9$ is selected from $C_1$-$C_{20}$, linear or branched alkyl groups; or are selected from —COOR$_{10}$ groups wherein $R_{10}$ is selected from $C_1$-$C_{20}$, linear or branched alkyl groups; or are selected from optionally substituted aryl groups; or are selected from optionally substituted heteroaryl groups;

A represents an electron acceptor group;
n is an integer between 10 and 500.

4. The inverted polymer photovoltaic cell (or solar cell) according to claim 1, wherein said organic electron acceptor compound is selected from:

fullerene derivatives selected from [6,6]-phenyl-$C_{61}$-butyric acid methyl ester (PCBM), [6,6]-phenyl-$C_{71}$-butyric acid methyl ester (PC71BM), indene-$C_{60}$ bisadduct (ICBA), bis(1-[3-(methoxycarbonyl) propyl]-1-phenyl)-[6,6]$C_{62}$ (Bis-PCBM); or non-fullerene compounds, optionally polymeric, selected from compounds based on perylene-diimides or naphthalene-diimides and fused aromatic rings; indacenothiophenes with electron-poor terminal groups; compounds having an aromatic core capable of symmetrical rotation selected from derivatives of corannulene or truxenone.

5. The inverted polymer photovoltaic cell (or solar cell) according to claim 1, wherein said cathodic interlayer (buffer layer) comprises zinc oxide, or titanium oxide.

6. The inverted polymer photovoltaic cell (or solar cell) according to claim 1, wherein said cathode is of a material selected from: indium-tin oxide (ITO), fluorine-doped tin oxide (FTO), zinc oxide doped with aluminium (AZO), zinc oxide doped with gadolinium oxide (GZO); or it consists of grids in conductive material, said conductive material being selected from silver (Ag), copper (Cu), graphite, graphene, and of a transparent conductive polymer, said transparent conductive polymer being PEDOT: PSS [poly(3,4-ethylenedioxythiophene): polystyrene sulfonate]; or it consists of metal nanowires, said metal being selected from silver (Ag), or copper (Cu).

7. The inverted polymer photovoltaic cell (or solar cell) according to claim 1, wherein said cathode is associated with a support layer which is of transparent rigid material or transparent flexible material.

8. The inverted polymer photovoltaic cell (or solar cell) according to claim 1, wherein said at least one heteropolyacid is selected from heteropolyacids having general formula (I):

$$H_x[A(MO_3)_yO_z] \quad (I)$$

wherein:
A represents a silicon atom, or a phosphorus atom;
M represents an atom of a transition metal belonging to group 5 or 6 of the Periodic Table of the Elements;
x is an integer that depends on the valence of A;
y is 12 or 18;
z is 4 or 6.

9. The inverted polymer photovoltaic cell (or solar cell) according to claim 1, wherein said at least one heteropolyacid is selected from heteropolyacids having general formula (II):

$$H_x[A(Mo)_p(V)_qO_{40}] \quad (II)$$

wherein:
A represents a silicon atom, or a phosphorus atom;
x is an integer that depends on the valence of A;
p is 6 or 10;
q is 2 or 6.

10. The inverted polymer photovoltaic cell (or solar cell) according to claim 8, wherein said at least one heteropolyacid is selected from: hydrated phosphomolybdic acid $\{H_3[P(MoO_3)_{12}O_4]\cdot nH_2O\}$, phosphomolybdic acid $\{H_3[P(MoO_3)_{12}O_4]\}$ in alcoholic solution, hydrated phosphotungstic acid $\{H_3[P(WO_3)_{12}O_4]\cdot nH_2O\}$, phosphotungstic acid in alcoholic solution $\{H_3[P(WO_3)_{12}O_4]\}$, hydrated silicomolybdic acid $\{H_4[Si(MoO_3)_{12}O_4]\cdot nH_2O\}$, silicomolybdic acid $\{H_4[Si(MoO_3)_{12}O_4]\}$ in alcoholic solution, hydrated silicotungstic acid $\{H_4[Si(WO_3)_{12}O_4]\cdot nH_2O\}$, silicotungstic acid $\{H_4[Si(WO_3)_{12}O_4]\}$ in alcoholic solution, hydrated phosphomolybdovanadic acid $\{H_3[P(Mo)_6(V)_2O_{40}]\cdot nH_2O\}$, phosphomolybdovanadic acid $\{H_3[P(Mo)_6(V)_2O_{40}]\}$ in alcoholic solution, hydrated phosphomolybdovanadic acid $\{H_3[P(Mo)_{10}(V)_2O_{40}]\cdot nH_2O\}$, phosphomolybdovanadic acid $\{H_3[P(Mo)_{10}(V)_2O_{40}]\}$ in alcoholic solution or mixtures thereof.

11. The inverted polymer photovoltaic cell (or solar cell) according to claim 1, wherein said amino compound is selected from:
low molecular weight aliphatic amines, containing from 8 to 24 carbon atoms, linear or branched, primary, secondary or tertiary selected from n-octylamine, n-dodecylamine, n-hexadecylamine, di-n-octylamine, or mixtures thereof;
conjugated polymers containing chain or side amino groups selected from poly [bis(4-phenyl) (2,4,6-trimethylphenyl)amine](PTAA), poly(N,N-bis-4-butylphenyl-N,N'-bisphenyl)benzidine (polyTPD), poly [(9,9-bis(3'-(N,N-dimethylamino) propyl)-2,7-fluorene)-alt-2,7-(9,9-dioctyl-fluorene)](PFN), or mixtures thereof;
or
mixtures thereof.

12. A process for preparing the inverted polymer photovoltaic cell (or solar cell) according to claim 1, the process including the following steps:
forming the cathode by sputtering; or by electron beam assisted deposition; or by depositing a transparent conductive polymer via spin coating, or gravure printing, or flexographic printing, or slot die coating, preceded by deposition of grids in conductive material via evaporation, or screen-printing, or spray-coating, or flexographic printing; or by depositing an ink based on metal nanowires via spin coating, or gravure printing, or flexographic printing, or slot die coating,
forming the cathodic interlayer (buffer layer) by spin coating, or gravure printing, or flexographic printing, or slot die coating above said cathode,
forming the active layer by spin coating, or gravure printing, or slot-die coating, above said cathodic interlayer (buffer layer),
forming the second anodic interlayer (buffer layer) by spin coating, or gravure printing, or screen-printing, or flexographic printing, or slot-die coating above said active layer,
forming the first anodic interlayer (buffer layer) by spin coating, or gravure printing, or screen-printing, or flexographic printing, or slot-die coating, above said second anodic interlayer (buffer layer), and
forming the anode by vacuum evaporation, or screen-printing, or spray-coating, or flexographic printing, above said first anodic interlayer (buffer layer); or by deposition of a transparent conductive polymer via spin coating, or gravure printing, or flexographic printing, or slot die coating, followed by deposition of grids in conductive material via evaporation, or screen-printing, or spray-coating, or flexographic printing, above said first anodic interlayer (buffer layer); or by deposition of an ink based on metal nanowires via spin coating, or gravure printing, or flexographic printing, or slot die coating, above said first anodic interlayer (buffer layer).

13. The inverted polymer photovoltaic cell (or solar cell) according to claim 1, wherein:
the anode has a thickness ranging between 50 nm and 150 nm;
the first anodic interlayer (buffer layer) has a thickness ranging between 10 nm and 2000 nm;
the second anodic interlayer (buffer layer) has a thickness ranging between 1 nm and 100 nm;
the active layer has a thickness ranging between 50 nm and 500 nm;
the cathodic interlayer (buffer layer) has a thickness ranging between 10 nm and 100 nm; and
the cathode has a thickness ranging between 50 nm and 150 nm.

14. The inverted polymer photovoltaic cell (or solar cell) according to claim 3, wherein said photoactive organic polymer is selected from: PffBT4T-2OD (poly [(5,6-difluoro-2,1,3-benzothiadiazol-4,7-diyl)-alt-(3,3'-di(2-octyldodecyl)-2,2';5',2'';5'',2''-quaterthiophen-5,5''-diyl)]), PBDT-TPD {poly [[5-(2-ethylhexyl)-5,6-dihydro-4,6-dioxo-4H-thieno [3,4-c]pyrrole-1,3-diyl) [4,8-bis[(2-ethylhexyl)oxy]benzo[1,2-b: 4,5-b']dithiophene-2,6-diyl]}, PTB7 {poly [[4,8-bis[(2-ethylhexyl)oxy]benzo[1,2-b: 4,5-b']dithiophene-2,6-diyl][3-fluoro-2-[(2-ethylhexyl) carbonyl]thieno [3,4-b]thiophenediyl]]}, PBDB-T {poly [[4,8-bis[5-(2-ethylhexyl)-2-thienyl]benzo[1,2-b: 4,5-b']dithiophene-2,6-diyl]-2,5-thiophenediyl[5,7-bis(2-ethylhexyl)-4,8-dioxo-4H,8H-benzo [1,2-c: 4,5-c']dithiophene-1,3-diyl]]}; or the polymers comprising antradithiophene derivatives having general formula (X).

15. The inverted polymer photovoltaic cell (or solar cell) according to claim 4, wherein said fullerene derivative is selected from [6,6]-phenyl-$C_{61}$-butyric acid methyl ester (PCBM) or [6,6]-phenyl-$C_{71}$-butyric acid methyl ester (PC71BM); and
said non-fullerene compound is selected from 3,9-bis {2-methylene-[3-(1,1-dicyanomethylene)-indanone]}-5,5,11,11-tetrakis(4-hexylphenyl)-dithieno [2,3-d: 2',3'-d']-s-indacene[1,2-b: 5,6-b']-dithiophene or poly {[N,N-bis(2-octyldodecyl)-1,4,5,8-naphthalenediamine-2,6-diyl]-alt-5,5'-(2,2'-bithiophene)}.

16. The inverted polymer photovoltaic cell (or solar cell) according to claim 7, wherein said transparent rigid material is glass and said transparent flexible material is selected from polyethylene terephthalate (PET), polyethylene naphthalate (PEN), polyethyleneimine (PI), polycarbonate (PC), polypropylene (PP), polyimide (PI), triacetyl cellulose (TAC), or copolymers thereof.

* * * * *